United States Patent
Fukuda et al.

(10) Patent No.: US 6,657,367 B1
(45) Date of Patent: Dec. 2, 2003

(54) DIELECTRIC BARRIER DISCHARGE LAMP DEVICE

(75) Inventors: Satoru Fukuda, Himeji (JP); Nobuyuki Hishinuma, Himeji (JP); Shinji Sugioka, Kakogawa (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 176 days.

(21) Appl. No.: 09/703,596

(22) Filed: Nov. 2, 2000

(30) Foreign Application Priority Data

Nov. 2, 1999 (JP) .............................. 11-312155

(51) Int. Cl.$^7$ .............................. H01J 11/00; H01J 65/00
(52) U.S. Cl. .................. 313/234; 313/607; 313/634; 313/231.71; 313/22
(58) Field of Search .................. 313/25, 634, 234, 313/231.71, 35, 17, 22; 220/2.1 R, 2.2; 362/217, 219, 222, 224, 225

(56) References Cited

U.S. PATENT DOCUMENTS

| | | | |
|---|---|---|---|
| 4,777,407 A | * 10/1988 | Takenaka et al. | 313/2.1 |
| 5,283,498 A | * 2/1994 | von Arx et al. | 313/17 |
| 5,751,327 A | * 5/1998 | De Cock et al. | 165/80.4 |
| 5,763,999 A | * 6/1998 | Matsuno et al. | 313/234 |
| 6,124,600 A | * 9/2000 | Moroishi et al. | 250/492.1 |

FOREIGN PATENT DOCUMENTS

| | | | | |
|---|---|---|---|---|
| JP | 10289694 A | * 10/1998 | | H01J/65/04 |
| JP | 2000011960 A | * 1/2000 | | H01J/65/00 |

\* cited by examiner

Primary Examiner—Ashok Patel
Assistant Examiner—Anthony Perry
(74) Attorney, Agent, or Firm—Nixon Peabody LLP; David S. Safran

(57) ABSTRACT

A dielectric barrier discharge lamp device which allows ultraviolet rays to be uniformly radiated onto a workpiece having a large surface area and which can be easily adapted to the size of workpiece. In the dielectric barrier, at least one dielectric barrier discharge lamp is arranged in a hermetically sealed casing which has a hollow longitudinally extending main part that is closed at both ends by end parts, at least a portion of the main part of the casing defining a window allowing light radiated from the at least one dielectric barrier discharge lamp to pass therethrough onto the workpiece. At least one end part of the casing is provided with a passage allowing inert gas to be introduced into the casing, and at least one end part of the casing is adapted to allow loading or unloading of the at least one dielectric barrier discharge lamp. A plurality of casings are arranged side by side with their windows facing the workpiece to be irradiated.

12 Claims, 4 Drawing Sheets

DIELECTRIC BARRIER DISCHARGE LAMP DEVICE

BACKGROUND OF THE INVENTION

1. Field of the Invention

This invention relates to a dielectric barrier discharge lamp device.

2. Description of Related Art

As shown in FIG. 1, a known dielectric barrier discharge lamp 2 of a substantially hollow cylindrical shape is comprised of a discharge container 21 made of quartz having an entire length of about 300 mm. A discharge space is enclosed between an inner tube 22 and an outer tube 23 which are arranged coaxially. The inner tube 22 has an inner diameter D1 of 12 to 15 mm and the outer tube 23 has an outer diameter D2 of 24 to 27 mm. The outer surfaces of the inner tube 22 and the outer tube 23 are provided with electrodes 24, 25 made of a metallic net for allowing light to pass therethrough.

A dielectric barrier discharge lamp device used in connection with such a dielectric barrier discharge lamp as described above is constructed such that a plurality of dielectric barrier discharge lamps 2 are arranged in one casing 10. Light radiated from each of the dielectric barrier discharge lamps 2 passes through a glass window 3 arranged in the casing 10 and is radiated onto a processed item W (hereinafter also called a workpiece).

In addition, in the case of a dielectric barrier discharge lamp whose discharge container 21 is filled with xenon or argon or krypton, light radiated from the dielectric barrier discharge lamp 2 is vacuum ultraviolet light. In this case, when oxygen is present around the dielectric barrier discharge lamps 2, the vacuum ultraviolet light is absorbed by the oxygen and is no longer irradiated onto the processed item W. As a counter-measure, the inner side of the casing 10 is therefore purged with nitrogen.

That is, the dielectric barrier discharge lamps 2 are arranged in a space sealed hermetically by the casing 10 and the window 3.

In FIG. 2, a cooling block 4 is used for cooling the dielectric barrier discharge lamps 2, and a cooling pipe 6 for cooling medium is used for cooling the cooling block 4. Further, mirrors 5 are arranged for reflecting light radiated from the dielectric barrier discharge lamps 2.

In recent years, as the processed item has become larger and larger, a plurality of dielectric barrier discharge lamps 2 have been arranged in the casing 10 so as to adapt the device to the larger processed item. As a result, the size of the window 3 was increased, and it became quite difficult to manufacture the component for use as the integrally assembled large window. In addition, although the component for use as the integrally assembled large-size window was made by melting and molding glass substances, the window component had the problem of being difficult to manufacture as regards a uniform transmission factor, and the ultraviolet ray intensity on the processed item became nonuniform.

Further, in the case that the number of dielectric barrier discharge lamps 2 was changed in response to the size of the processed item, it was necessary to reconstruct the casing 10 itself or to prepare a plurality of casings of different sizes in advance.

SUMMARY OF THE INVENTION

The present invention has been made in view of the foregoing circumstances, and it is an object of the present invention to provide a dielectric barrier discharge lamp device for uniformly emitting ultraviolet rays on a processed item having an increased surface area.

According to a further object, the dielectric barrier discharge lamp device should be easily adaptable to the size of the processed item by merely changing the number of casings containing the dielectric barrier discharge lamps in response to the size of the processed item.

The dielectric barrier discharge lamp device of the invention is characterized in that at least one dielectric barrier discharge lamp is arranged in a hermetically sealed casing, said casing comprising a hollow longitudinally extending main part that is closed at both ends by end parts, at least a portion of said main part of the casing defining a window allowing light radiated from the at least one dielectric barrier discharge lamp to pass therethrough onto the workpiece. At least one end part of the casing is provided with a passage allowing inert gas to be introduced into the casing. Further, at least one of the end parts is adapted such as to allow loading or unloading of the at least one dielectric barrier discharge lamp. According to the invention, a plurality of casings are arranged side by side with their windows facing the workpiece to be irradiated.

In the dielectric barrier discharge lamp device of the present invention, when the processing area of the processed item is increased, the number of casings having the at least one dielectric barrier discharge lamp arranged therein is correspondingly increased so that a large-size integral window is not required and the size of the window of each of the casings need not be increased. As a result, a relatively small window having a high and uniform transmission factor can be used for each of the casings, and the intensity of ultraviolet rays on the processed item can be made uniform.

In addition, the dielectric barrier discharge lamp device can be easily adapted to the size of the processed item by merely changing the number of casings.

DETAILED DESCRIPTION OF THE INVENTION

Figure 3:
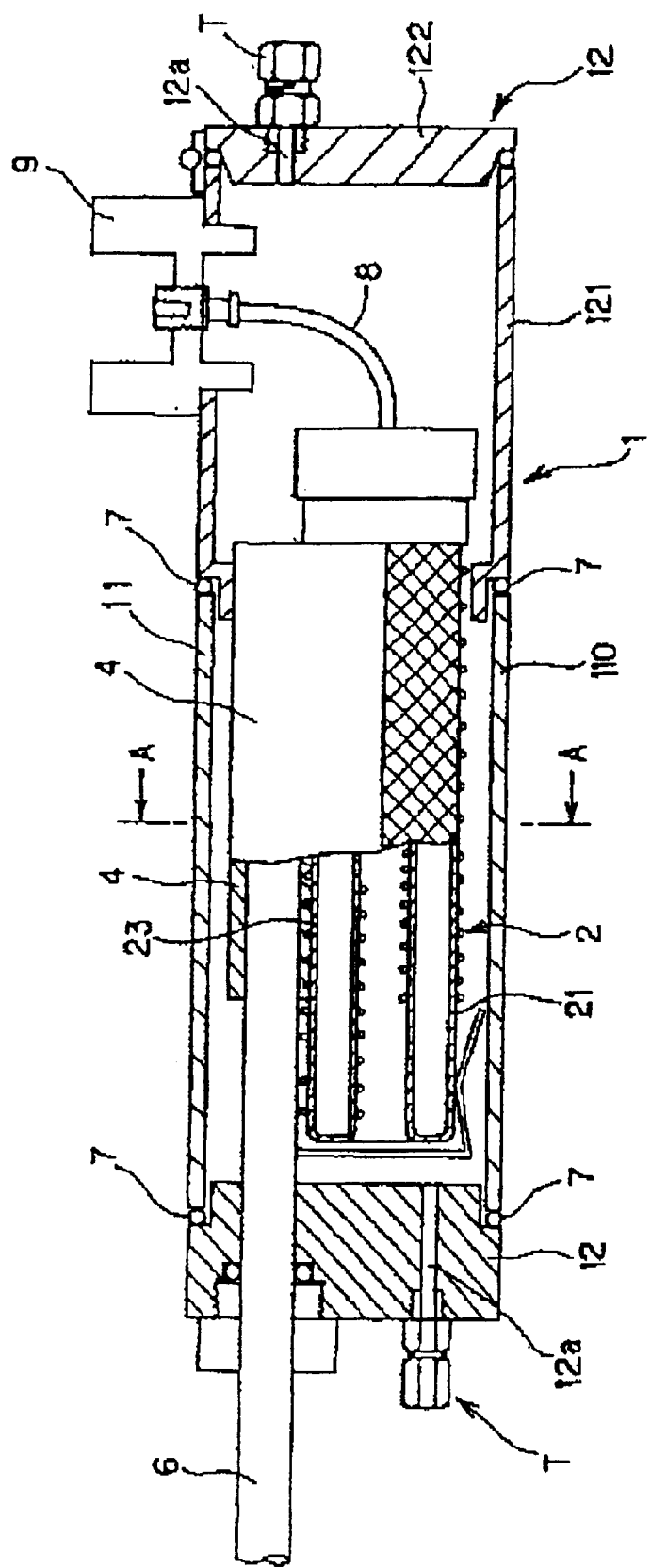
FIG. 3 shows a casing containing a dielectric barrier discharge lamp in accordance with the present invention.
Figure 4:
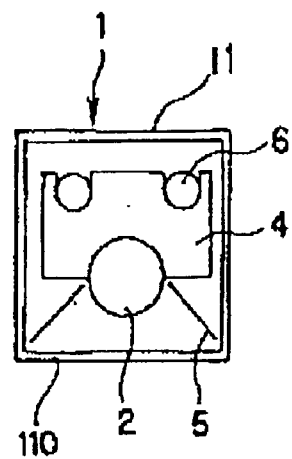
FIG. 4 is a sectional view taken along line A—A of FIG. 3.

FIG. 3 is an illustrative view showing an example of a casing of the dielectric barrier discharge lamp device of the present invention. FIG. 4 is a sectional view taken along the section line A—A shown in FIG. 3.

Figure 1:
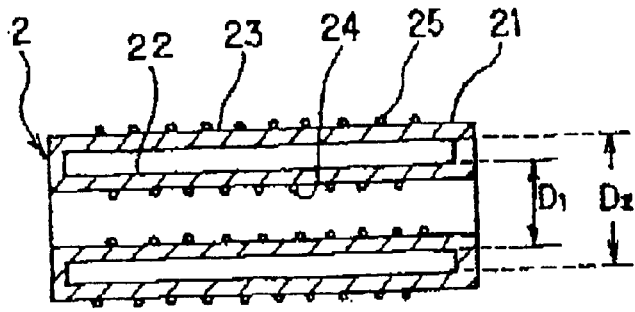
FIG. 1 shows a known dielectric barrier discharge lamp which can be used in connection with the lamp device of the invention.
Figure 2:
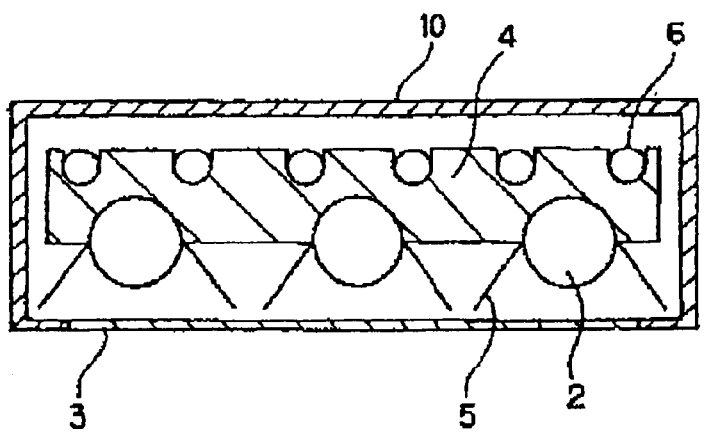
FIG. 2 is a schematic view of a prior art dielectric barrier discharge lamp device.
Figure 2:

The dielectric barrier discharge lamp 2 is similar to that shown in FIG. 1, wherein a discharge container 21 has a longitudinal length of about 600 mm and the remaining reference numerals denote the same elements as in FIG. 1. The mirror for reflecting light radiated from the dielectric barrier discharge lamp 2 is not shown in FIG. 3 for sake of clarity.

The casing 1 is constituted by a longitudinally extending side wall 11 as the main part of the casing and end walls 12 as the end parts arranged at both ends of the side wall.

The side wall 11 has a hollow pillar-like shape and is entirely made of quartz glass. It has a square cross-section and its outer shape is rectangular having a longitudinal size of 60 mm, a lateral size of 60 mm and a length of 650 mm.

The end walls 12 are made of a metallic block of aluminum. A cooling pipe 6 for passage of cooling fluid for cooling the dielectric barrier discharge lamp 2 stored in the casing 1 extends through one end wall 12. This cooling pipe 6 is of a U-shape with the crossbeam arranged within the casing 1 and the shanks passing through the end wall 12. The cooling pipe 6 also passes through the cooling block 4 which is in contact with the outer tube 23 of the dielectric barrier discharge lamp 2 and so cools the cooling block 4 and also the dielectric barrier discharge lamp 2.

The other end wall 12 is comprised of a cylindrical part 121 having substantially the same shape as the outer shape of the side wall 11 and an opening or closing part 122 which may function as a door for use in loading or unloading the dielectric barrier discharge lamp 2 into or out of the casing 1.

In addition, the cylindrical part 121 has a connector 9 connected to a lead wire 8 for applying a voltage to the dielectric barrier discharge lamp 2 at a location opposite to the window 110.

The end walls 12 are fixed to the side wall 11 by O-rings 7 so that the end walls 12 are hermetically connected to both ends of the longitudinally extending side wall 11 resulting in a casing 1 which is hermetically sealed.

In addition, the end walls 12 of the casing 1 are provided with flow passages 12a for nitrogen gas or some other inert gas so that the inside of the casing 1 can be purged with nitrogen through the flow passages 12a. The flow passages 12a are provided with a coupler T and are connected to a gas flow pipe not shown in the figure.

Accordingly, the nitrogen gas introduced through one flow passage 12a is discharged out of the other flow passage 12a, the inside of the casing 1 is purged with nitrogen and vacuum ultraviolet light emitted by the dielectric barrier discharge lamp is radiated against the processed item without being absorbed in the casing 1.

In this case, one dielectric barrier discharge lamp 2 is stored in the casing 1, and the entire side wall 11 is made of quartz glass for allowing ultraviolet rays to pass therethrough and one surface of the side wall 11 is used as a window 110.

However, the side wall 11 may be made of metal or any other suitable material which does not allow ultraviolet rays to pass. In this case, it is necessary that a window for passage of the ultraviolet rays is arranged at one surface of the side wall 11. Preferably, a glass component is applied as this window.

Figure 5:
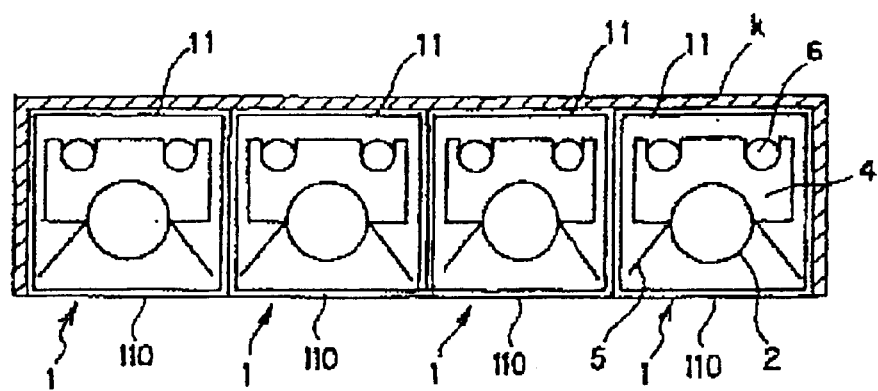
FIG. 5 is an illustrative view showing the dielectric barrier discharge lamp device of the present invention.
Figure 5:

Then, as shown in FIG. 5, a plurality of casings 1 having a dielectric barrier discharge lamp 2 arranged therein is combined with the dielectric barrier discharge lamp device of the invention in accordance with the size of the item W to be processed, i.e., the processing area of the processed item W, in such a way that the window 10 of the casing 1 faces toward the processed item W.

In a preferred embodiment, four casings are arranged side by side in accordance with a common processing area of the processed item.

In a preferred embodiment, a coupling case (or outer casing) K is applied as means for arranging the casings 1 side by side. The means for side-by-side assembly of the casings 1 within the coupling case K is not particularly limited, and any kind of suitable means may be applied.

In the dielectric barrier discharge lamp device as described above, when an item or workpiece W having a large surface area, respectively a large processing area, is to be processed, it is only necessary that the number of the casings 1 having a dielectric barrier discharge lamp 2 arranged therein be chosen in correspondence with this area. It is no longer necessary to prepare a large-size integral window as in the prior art. The size of the window 110 in each of the casings 1 need not be increased, and the window 110 of each of the casings can be prepared such as to have a uniform transmission factor resulting in a uniform illumination of the processed item even if the processing area is increased.

In addition, since merely changing the number of casings 1 enables the lamp device of the invention to be adapted to the size of the processed item, it is not necessary to provide a plurality of different types of casings as was the case in the prior art. Thus, the invention provides a dielectric barrier discharge lamp device capable of easily being adapted to the size of any workpiece to be processed.

Figure 6:
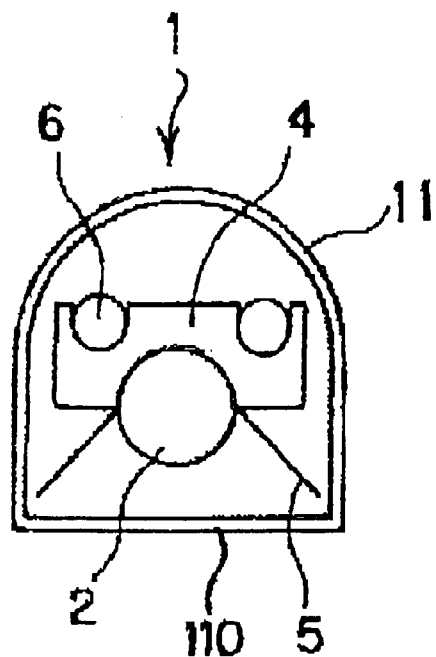
FIG. 6 is a cross-sectional view showing another preferred embodiment of a casing used in the dielectric barrier discharge lamp device of the present invention.
Figure 7:
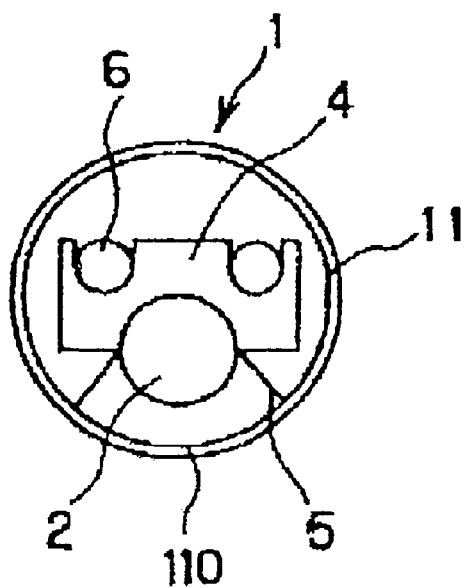
FIG. 7 is a cross-sectional view showing a still further preferred embodiment of a casing used in the dielectric barrier discharge lamp device of the present invention.

FIGS. 6 & 7 illustrate another example of a casing in which a dielectric barrier discharge lamp is stored.

FIG. 6 shows a case in which the side wall 11 of the casing 1 is made of quartz glass and its sectional shape is dome-like (i.e., one side of the casing is planar and the other portions are curved and have an arcuate shape).

FIG. 7 shows an example in which the side wall 11 of the casing 1 is a quartz glass tube having a circular cross-section. A part of the side wall 11 is used as a window 110 through which light from the dielectric barrier discharge lamp permeates.

In the case of the device shown in FIG. 7, since the sectional shape of the casing 1 is circular, the quartz glass pipe, as such, can be utilized as a casing so that the casing can be easily manufactured.

Again, each of the casings 1 has a cooling block 4 and a cooling pipe 6 for cooling the dielectric barrier discharge lamp 2 and a mirror 5 arranged therein.

The invention is not limited to the specific casings described above but various modifications can be made. Further, although it is preferred to arrange only one lamp within each casing, more than one lamp per casing may be used as well and the invention is not limited to the lamps explicitly described in connection with FIG. 1.

It is to be understood that although preferred embodiments of the invention have been described, various other embodiments and variations may occur to those skilled in the art. Any such other embodiments and variations which fall within the scope and spirit of the present invention are intended to be covered by the following claims.

What is claimed is:

1. A dielectric barrier discharge lamp device for irradiation of a workpiece, comprising a hermetically sealed casing, said casing comprising a hollow longitudinally extending main part that is closed at both ends by end parts, at least a portion of said main part of the casing defining a window allowing light radiated from a dielectric barrier discharge lamp to pass therethrough onto the workpiece, wherein at least one of the end parts of the casing is provided with a passage allowing inert gas to be introduced in to the casing; wherein at least one end part of the casing is adapted to allow loading and unloading of a dielectric barrier discharge lamp;

and wherein a plurality of casings are arranged side by side with their windows facing the workpiece to be irradiated, each casing being size so as to be able to receive only a single dielectric barrier discharge lamp; and wherein only one dielectric barrier discharge lamp is disposed in each casing.

2. A dielectric barrier discharge lamp device as claimed in claim 1, wherein the casings are arranged longitudinal axes thereof essentially parallel.

3. A dielectric barrier discharge lamp device as claimed in claim 1, wherein the casings are arranged in an outer casing which is open on a side facing the workpiece to be irradiated.

4. A dielectric barrier discharge lamp device as claimed in claim 1, wherein the casing comprises a cooling block and a cooling pipe for cooling fluid extending through said cooling block, said cooling pipe extending through an opening in one of the end parts of the casing.

5. A dielectric barrier discharge lamp device as claimed in claim 4, wherein the cooling pipe is essentially U-shaped with an angled part being arranged in the casing and leg parts extending out of the casing through openings in one of the end parts of the casing.

6. A dielectric barrier discharge lamp device as claimed in claim 1, wherein the main part of the casing has an essentially square cross-section.

7. A dielectric barrier discharge lamp device as claimed in claim 1, wherein the main part of the casing has an essentially circular cross-section.

8. A dielectric barrier discharge lamp device as claimed in claim 1, wherein the main part of the casing has an essentially arcuate cross-section with one side thereof being planar.

9. A dielectric barrier discharge lamp device as claimed in claim 1, wherein the main part of the casing consists of quartz glass.

10. A dielectric barrier discharge lamp device as claimed in claim 1, wherein the main part mainly of the casing consists of a material impervious to the light emitted by the dielectric barrier discharge lamp and has a window made of a material which allows the light emitted by the dielectric barrier discharge lamp to pass.

11. A dielectric barrier discharge lamp device as claimed in claim 1, wherein the end parts consist of aluminum.

12. A dielectric barrier discharge lamp device as claimed in claim 1, wherein at least one of the end parts comprises a passage for introducing an inert gas into the casing.

* * * * *